US006286684B1

United States Patent
Brooks et al.

(10) Patent No.: US 6,286,684 B1
(45) Date of Patent: Sep. 11, 2001

(54) PROTECTIVE SYSTEM FOR INTEGRATED CIRCUIT (IC) WAFERS RETAINED WITHIN CONTAINERS DESIGNED FOR STORAGE AND SHIPMENT

(75) Inventors: Ray G. Brooks, 2436 Aberdeen Dr., Bedford, TX (US) 76021; Timothy Brooks, Euless, TX (US); Steve L. Fowler, Moore, SC (US); Robert A. Neal, Wales, ME (US)

(73) Assignee: Ray G. Brooks, Bedford, TX (US)

( * ) Notice: Subject to any disclaimer, the term of this patent is extended or adjusted under 35 U.S.C. 154(b) by 0 days.

(21) Appl. No.: 09/621,511

(22) Filed: Jul. 21, 2000

Related U.S. Application Data
(60) Provisional application No. 60/186,070, filed on Feb. 29, 2000, and provisional application No. 60/145,320, filed on Jul. 23, 1999.

(51) Int. Cl.$^7$ .................................................. B65D 85/48
(52) U.S. Cl. .......................... 206/710; 206/303; 206/454; 206/523
(58) Field of Search .................................. 206/303, 484, 206/484.2, 454, 455, 523, 591, 593, 594, 710, 718–721; 211/41.18; 118/500

(56) References Cited

U.S. PATENT DOCUMENTS

| | | |
|---|---|---|
| 4,061,228 | 12/1977 | Johnson . |
| 4,339,039 | 7/1982 | Mykleby . |
| 4,700,403 | 10/1987 | Vacanti . |
| 4,799,275 | 1/1989 | Sprague, Jr. . |
| 5,366,079 * | 11/1994 | Lin et al. .............................. 206/710 |
| 5,553,711 * | 9/1996 | Lin et al. .............................. 206/710 |
| 5,642,813 | 7/1997 | Nyseth . |
| 5,699,916 * | 12/1997 | Liang ..................................... 206/710 |
| 5,724,748 | 3/1998 | Brooks et al. . |
| 5,830,553 | 11/1998 | Huang . |
| 5,964,344 * | 10/1999 | Hatada .................................. 206/710 |
| 5,988,393 | 11/1999 | Hsia et al. . |
| 6,012,188 | 1/2000 | Daniels et al. . |
| 6,119,865 * | 9/2000 | Kawada ............................... 206/710 |

OTHER PUBLICATIONS

International Search Report for International Application PCT/US00/20024 dated Oct. 18, 2000.

* cited by examiner

*Primary Examiner*—Luan K. Bui
(74) *Attorney, Agent, or Firm*—Geoffrey A. Mantooth

(57) ABSTRACT

A container for integrated circuit wafers provides protection for the wafers from mechanical shock and electrical charges. The wafers are mechanically protected by top and bottom cushions and side cushions. The top and bottom cushions each have foam within a membrane or film enclosure. The enclosure has openings so as to allow gas to pass in and out. The side cushions have resilient projections that protect the edges of the wafers. The side cushions are interposed between flanges of the top and bottom cushions. The individual wafers are separated from each other by leaf separators made of film. The film for the separators and the top and bottom cushions can be the same type. The film has a first layer made of a polymer with dissipative material therein and a second layer made of a polymer without the dissipative material. The first and second layers are coupled together. The insulating layer is placed into contact with a circuit side of the wafer. The dissipative material can be carbon. The container has a grounding stud in a wall. The grounding stud contacts the film on the inside of the container and can contact a ground on the exterior of the container.

12 Claims, 7 Drawing Sheets

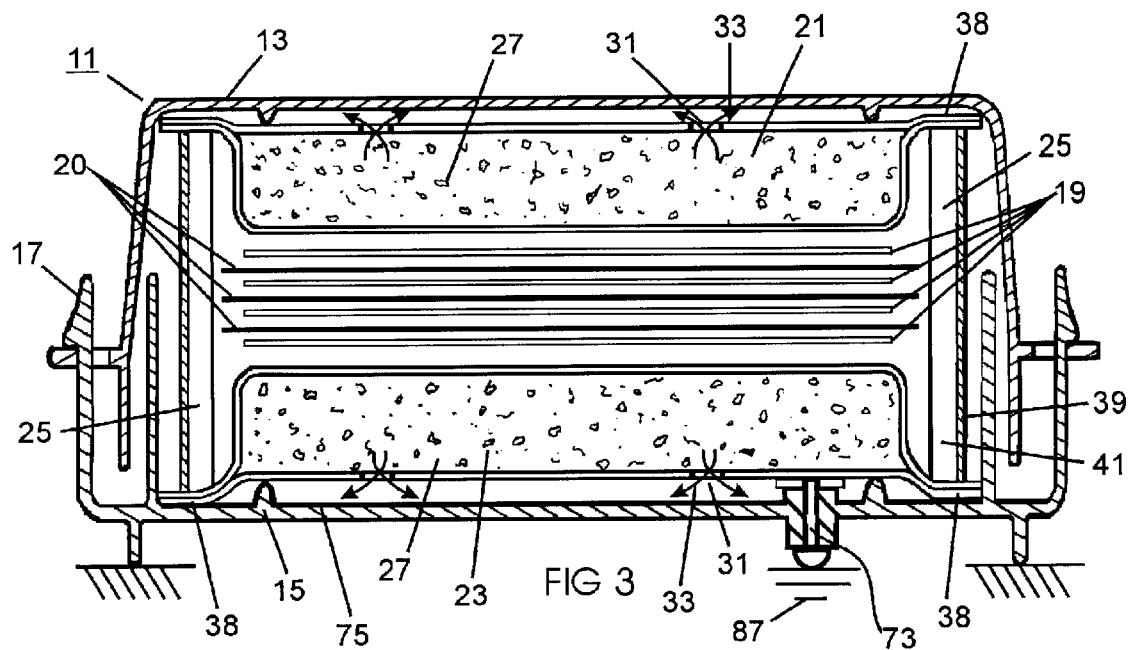
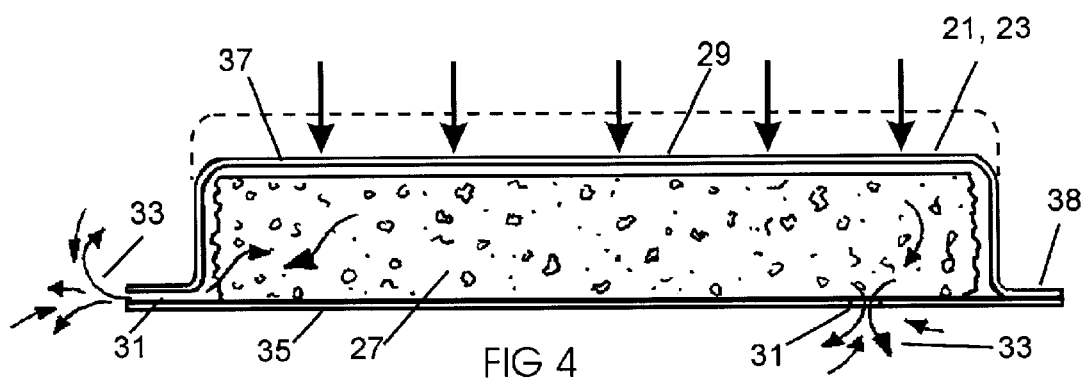

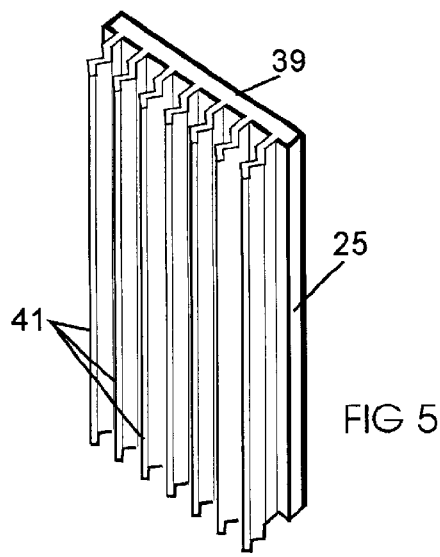
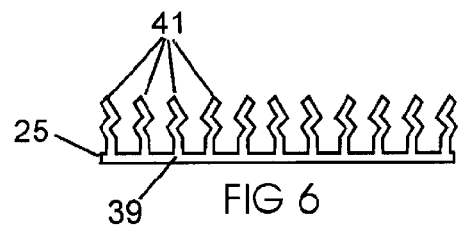
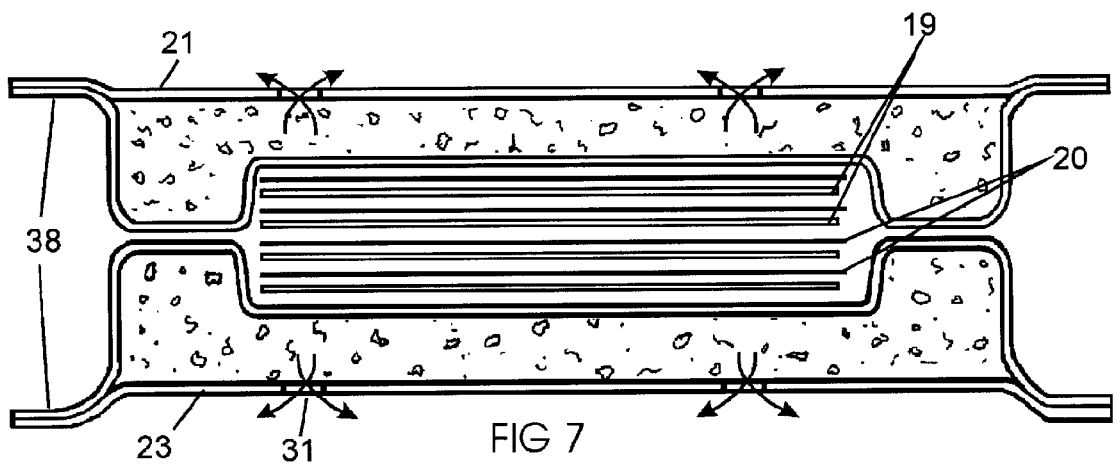
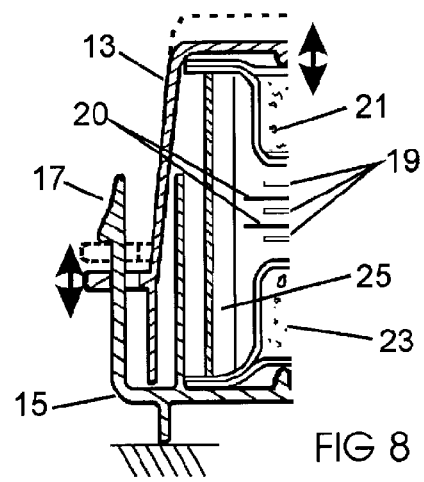

PROTECTIVE SYSTEM FOR INTEGRATED CIRCUIT (IC) WAFERS RETAINED WITHIN CONTAINERS DESIGNED FOR STORAGE AND SHIPMENT

This application relates to U.S. provisional applications No. 60/145,320, filed Jul. 23, 1999 and Ser. No. 60/186,070, filed Feb. 29, 2000.

FIELD OF THE INVENTION

The present invention relates to a method and apparatus for protecting sensitive articles, such as integrated circuits, from electrostatic discharge and from mechanical shock.

BACKGROUND OF THE INVENTION

Integrated circuits (IC) are sensitive to damage due to mechanical shock. When integrated circuits are manufactured, they are contained on a substrate wafer, such as a silicon wafer. A single wafer may contain several dozen integrated circuits.

These wafers are often transported from one location to another, either in the same manufacturing facility or even from one manufacturing facility to another. The wafers that are to be transported are put into a container. Such a container is shown and described in U.S. Pat. No. 5,724,748. The wafers are stacked upon each other in horizontal fashion.

The wafers are brittle and easily damaged. If a container full of wafers is dropped or jarred, the wafers inside may break due to the mechanical shock. Thus, the container should contain some protection from mechanical shock.

In addition to mechanical shock, integrated circuits are sensitive to damage by electrostatic discharges (ESD) and electrical overstress (EOS). The circuits in integrated circuits are so small that they are easily susceptible to damage due to small charges that may accumulate.

In a wafer container, individual wafers are separated from adjacent wafers by leaf separators. Ideally, the leaf separators should protect the integrated circuits from damage due to electrostatic discharge. If a static charge on an integrated circuit is allowed to build up to a high level, then the charge is more likely to find a path to ground. This discharge results in a high instaneous flow of electrical energy, which flow is likely to overwhelm and damage the integrated circuit. In the prior art, the containers are made with walls impregnated with carbon. This allows electrical charges inside of the container to dissipate through the container walls. Unfortunately, the carbon in the walls sheds and can contaminate the integrated circuits inside of the container.

Thus, what is needed is a system to allow electrical charges on integrated circuit wafers inside of a container to dissipate harmlessly, without contaminating the integrated circuits.

SUMMARY OF THE INVENTION

It is an object of the present invention to provide a system for protecting integrated circuit wafers located inside of a container from mechanical shock.

It is another object of the present invention to provide a system for protecting integrated circuit wafers located inside of a container from electrostatic discharge and from electrical overstress.

There is provided a system for protecting integrated circuit wafers during storage and shipment. The system comprises a container having an interior space for receiving the wafers. There are first and second cushions positioned inside of the interior space so as to receive the wafers therebetween. Each of the first and second cushions has a compressible, resilient foam, with the foam being enclosed within a membrane. The membrane has one or more openings so as to allow gas to pass therethrough.

In accordance with one aspect of the invention the membrane of each of the first and second cushions comprises a film for protecting the wafers from electrostatic discharge. The film comprises a first layer made of a polymer with dissipative material therein and a second layer coupled to the first layer. The second layer is made of a polymer without the dissipative material.

In accordance with another aspect of the invention the wafers are in a stack configuration, with each of the wafers in the stack being separated from adjacent wafers by a separator. Each of the separators comprises a first layer made of a polymer with dissipative material therein and a second layer coupled to the first layer. The second layer is made of a polymer without the dissipative material.

In accordance with another aspect of the invention the wafers are in a stack configuration, with each of the wafers in the stack being separated from adjacent wafers by a separator. Each of the separators comprises a first film. The membrane of each of the first and second cushions comprises a second film for protecting the wafers from electrostatic discharge. The first and second films each comprise a first layer made of a polymer with dissipative material therein and a second layer coupled to the first layer. The second layer is made of a polymer without the dissipative material.

In accordance with another aspect of the invention, there is also a grounding conductor in contact with a portion of the second film and extending to an exterior of the container.

In accordance with another aspect of the invention, there are side cushions located around a periphery of the wafers. The side cushions comprise resilient projections extending from a base piece.

In accordance with another aspect of the invention, the first and second cushions each comprise flanges. The side cushions are interposed between the flanges.

In accordance with another aspect of the invention, each of the first and second cushions comprises a first membrane piece and a second membrane piece. The first and second membrane pieces each have edges and are coupled together along the edges so as to form an enclosure that receives the foam.

There is also provided a film for protecting articles from electrostatic discharge. The film comprises a first layer made of a polymer with dissipative material therein and a second layer coupled to the first layer. The second layer is made of a polymer without the dissipative material.

In accordance with another aspect of the invention, the first layer has a surface resistance of between $1\times10^4$–$1\times10^{11}$ ohms.

In accordance with another aspect of the invention, the dissipative material comprises carbon.

In accordance with another aspect of the invention, the polymer for the first and second layers comprises polyethylene and the dissipative material comprises carbon.

In accordance with another aspect of the invention, the second layer has a thickness that is less than 0.25 mils.

There is also provided a system for providing protection from electrostatic discharge. The system comprises a wafer comprising an integrated circuit, with the wafer having a circuit side. A film has a dissipative layer and an insulating layer. The film being in contact with the circuit side of the wafer such that the insulating layer is interposed between the dissipative layer and the wafer. There is also a container having an interior, with the wafer and the film being located in the container interior. The container has a conductive path from the container interior to an exterior of the container.

In accordance with another aspect of the invention, the dissipative layer of the film has a surface resistance of between $1\times10^4$–$1\times10^{11}$ ohms.

There is also provided a method for protecting an integrated circuit wafer from electrostatic discharge, with the wafer having a circuit side. The method comprises providing a film having a dissipative layer and an insulating layer. The film is located in contact with the circuit side of the wafer such that the insulating layer is interposed between the dissipative layer and the wafer. The wafer and the film are positioned inside of a container. A static charge is passed from the wafer to the dissipative layer through the insulating layer and out of the container to an exterior of the container.

There is also provided an enclosure for protecting articles from electromagnetic interference and radio frequency interference. The enclosure is made from a film that comprises first, second and third layers coupled together with the second layer being interposed between the first and third layers. The first, second and third layers are made of a polymer. The first and third layers are insulating. The second layer has a surface resistivity of 1 ohms or less.

Another enclosure for protecting sensitive articles from electrostatic discharge comprises a wall surrounding an interior, the interior being structured and arranged for receiving the sensitive articles. A grounding stud extends through the wall.

BRIEF DESCRIPTION OF THE DRAWINGS

FIG. 3 is a cross-sectional view of the container of FIG. 1, taken through lines III—III.

FIG. 4 is a cross-sectional view of a top or bottom cushion, subjected to mechanical shock.

FIG. 5 is an isometric view of a side cushion used in the container of FIGS. 1–4.

FIG. 6 is an end view of the side cushion of FIG. 5.

FIG. 7 is a cross-sectional view of the top and bottom cushions fitting around a stack of wafers.

FIG. 8 is a detail cross-sectional view of the container, showing the application of force thereto.

DESCRIPTION OF THE PREFERRED EMBODIMENT

Figure 1:
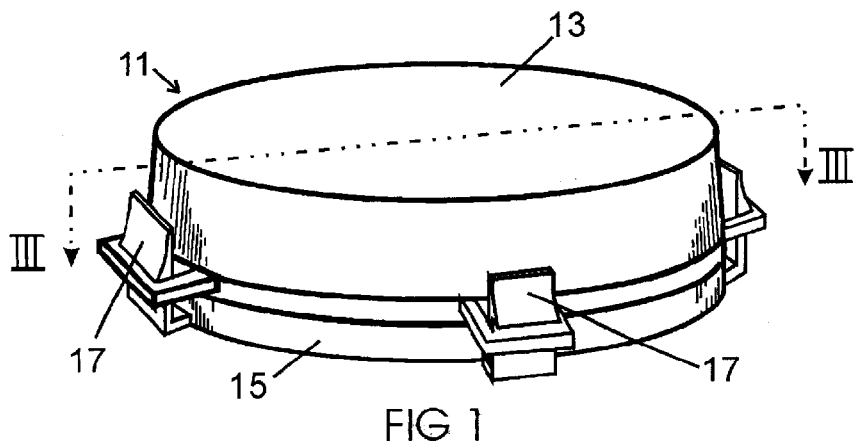
FIG. 1 is an isometric view of a container for integrated circuit wafers, incorporating the present invention, in accordance with a preferred embodiment.
Figure 2:
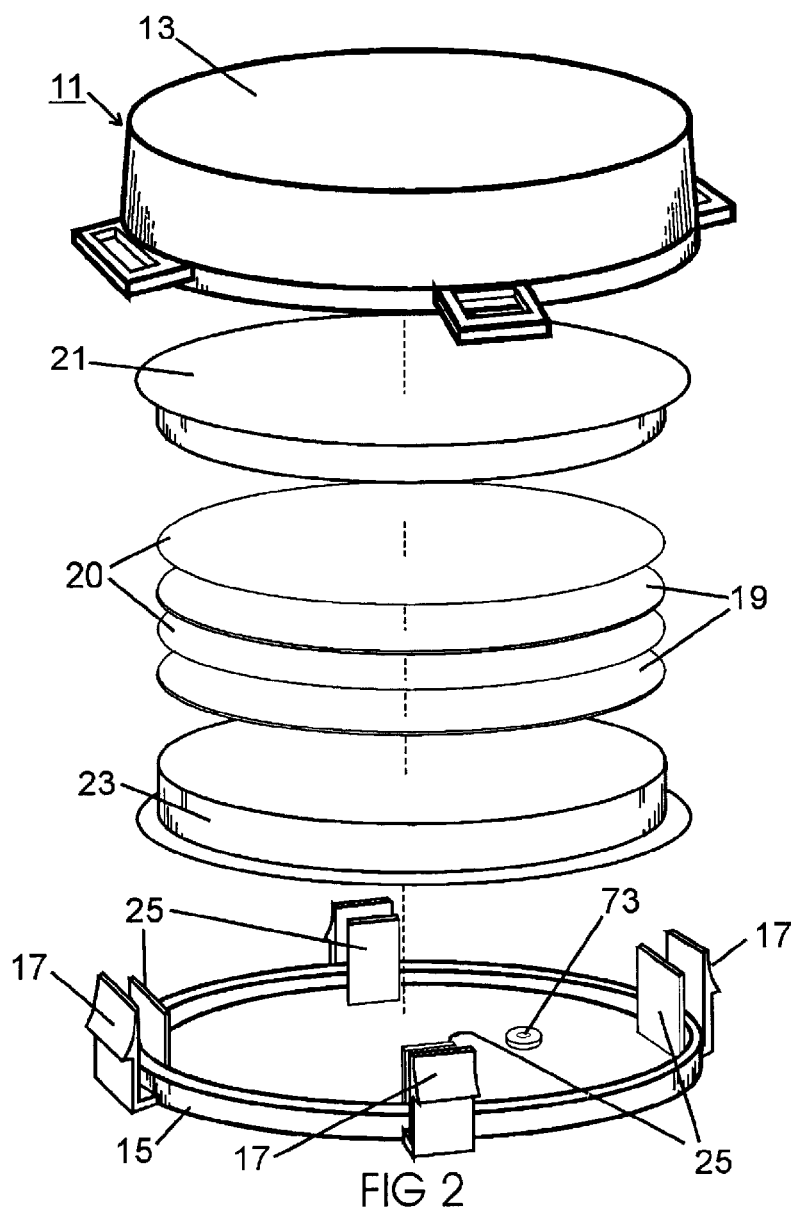
FIG. 2 is an exploded view of the container of FIG. 1 showing the mechanical protection components.

FIGS. 1 and 2 show an IC wafer box or container 11. The container has a top 13 and a bottom 15. Latches 17 are provided to lock the top and bottom together in the closed condition as shown in FIG. 1. The latches 17 allow the top to move somewhat relative to the bottom. The container 11 can be provided with or without gas-tight seals. Gas-tight seals are useful for maintaining a controlled environment inside of the container. Such a sealed container is shown and described in U.S. Pat. No. 5,724,748. The container shown in the drawings herein does not have a gas-tight seal.

As shown in FIG. 3, the container 11 has an interior space or cavity for containing a stack of IC wafers 19. The individual wafers 19 are interleaved with separators 20. The container is used for the transport and/or shipment of the wafers.

The container has a High Energy Absorbing System (HEA System), which by the combination of top, bottom and side cushioning 21, 23, 25 is designed to receive and absorb mechanical shock applied to the IC wafer box or container 11.

Referring to FIGS. 3 and 4, the top and bottom cushions 21, 23 are of substantially similar to one another. Each has a foam member 27. The foam member 27 is resilient and is open-cell. In the preferred embodiment, the foam member 27 is disc shaped because the container is disc shaped. Each foam member disk is covered by a film 29 that is air-tight and static-dissipative. The film 29 is made of the same material as the separators 20 that are provided between the wafers. The film 29 is provided with several openings 31 to allow the exchange of gas 33 therethrough.

In the preferred embodiment, each cushion 21, 23 is made from two pieces of film (see FIG. 4) that form an enclosure. One piece 35 is flat. The other piece 37 is bowl shaped to fit over the foam 27. The two pieces 35, 37 are coupled together along a flange 38 that extends around the circumference of the film. Heat welding can be used to bond the two pieces of film together. The openings 31 can be made by punctures through the film or by gaps between the two pieces 35, 37 in the flange 38 or by both.

Referring to FIGS. 5 and 6, the side cushions, or bumpers, 25 are provided around the circumference of the space that is to contain the wafers 19. The side cushions 25 cushion the edges of the wafers against mechanical shock. Each side cushion 25 is made of a relatively soft rubber or elastomeric material. There is a base piece 39 with integral parallel projections 41 extending from one surface or side of the base piece. The projections 41 extend somewhat crookedly from the base piece 39. The projections 41 initially extend perpendicularly from the base piece 39, then turn at about 45 degrees, then turn at about 90 degrees in the opposite direction, and then turn at about 90 degrees in the first direction. As shown in FIG. 6, the first direction need not be the same among adjacent projections.

To assemble the container, the bottom cushion 23 (see FIG. 3) is placed in the bottom of the container bottom 15. The flat film piece 35 of the cushion is against the container bottom 15 so that the flange 38 is located against the container bottom wall 75. The side cushions 25 are placed around the periphery in an upstanding or vertical position. One end of each of the side cushions 25 bears on the lip or flange 38 of the bottom cushion 23 such that the projections 41 extend radially inward. In the preferred embodiment four side cushions 25 are used, although more or less could also be satisfactory. The wafers 19 are then placed in a stack on top of the bottom cushion 23. The individual wafers are separated from each other by the separators 20, which will be described more fully hereafter. The stack has wafers stacked on top of one another and separated from each other by a separator. The edges of the wafers are initially spaced from the side cushions 25 (although during use of the container, the wafers can contact the side cushions). Then the top cushion 21 is placed on top of the topmost wafer such that its flange 38 is on top and bears on the top ends of the side cushions 25. The container top 13 is located thereon and latched to the container bottom 15.

As shown in FIG. 7, the wafers are interposed between the top and bottom cushions 21, 23 and the side cushions 25 are around the periphery of the wafers. The number of wafers 19 placed inside of the container can vary; there need not be a fixed number. This is because the top and bottom cushions 21, 23 will expand or contract to fill the available space inside of the container and around the wafer stack. Thus, the cushions 21, 23 and 25 need not be adjusted to accommodate different numbers of wafers 19.

If the container is subjected to a shock from the top or the bottom, then the wafers are protected by the top and bottom cushions 21, 23. The top and bottom cushions absorb shock in two ways. The foam member 27 is compressed, thus dissipating shock. In addition, gas is forced out of the cushion through the openings 31 in the film 29. The rate of gas release is controlled by the size and number of the openings 31. The released gas is vented to the interior of the container 11. After the shock has been dissipated, the foam will expand and draw gas back inside of the film to restore the top and bottom cushions to their original size.

If the container 11 is subjected to shock from the side, the side cushions 25 protect the edges of the wafers. The projections 41 are resilient so as to deform and absorb a mechanical shock.

The container top 13 can move relative to the container bottom 15, even when latched together. The latches 17 prevent the container top and bottom 13, 15 from separating beyond a certain distance. However, as shown in FIG. 8, the container top 13 can be forced into the container bottom. The cushions 21, 23, 25 protect the wafers from such movement and shock.

Figure 9:
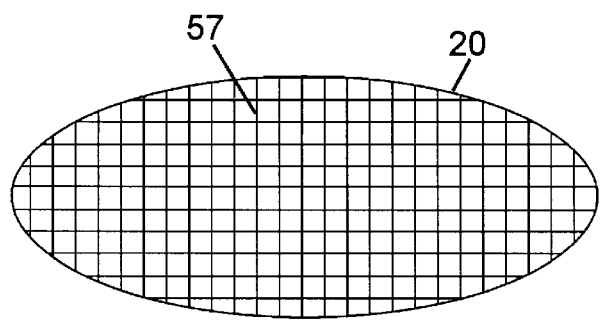
FIG. 9 shows the film cut into a circular shape to form an integrated circuit wafer separator.
Figure 10:
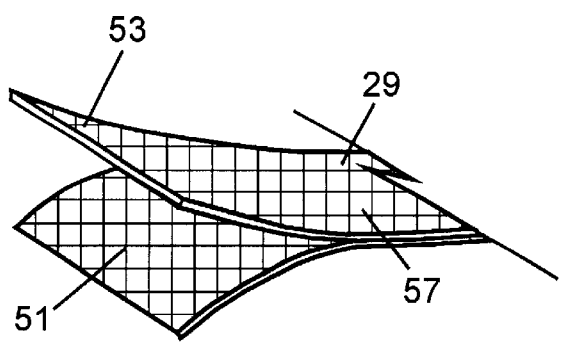
FIG. 10 is an isometric view of the film of the present invention, shown with the layers partially separated for illustrative purposes.

The leaf separators 20 will now be described. The separators are made from a film 29. FIGS. 9 and 10 show an isometric view of the multi-layer film 29 of the present invention, in accordance with a preferred embodiment. The film has two layers; namely a dissipative layer 51 and an insulating (or insulative) layer 53. The dissipative layer 51 is polyethylene with carbon; the carbon serves to dissipate electrical charges. The insulating layer 53 is polyethylene without carbon. The polyethylene is a low density type of polyethylene; however it is also believed that medium and high density polyethylenes will also be satisfactory. The dissipative layer 51 has a sufficient amount of carbon therein so that the surface resistance of the dissipative layer is between $1 \times 10^4$ to $1 \times 10^{11}$ ohms, as measured by the ESD Association Test Method S11.11. The thickness of the insulating layer 53 is 0.25 mils or less. If a thicker layer is used, then static charges may not be able to discharge effectively through the insulating layer. The thickness of the dissipative layer 51 can vary. We have found that thicknesses of 3, 5 and 9 mils work well. However other thicknesses, either smaller or greater, will also likely work well depending on the particular application.

In the preferred embodiment, the film 29 is made by a coextrusion process. Pellets of polyethylene containing carbon are extruded into a layer. Simultaneously, pellets of polyethylene without carbon are extruded into a layer. The two layers, being extruded together, are coupled together and form the film 29. In FIG. 10, the film is shown with the layers partially separated for illustrative purposes. The film 29 can likely be made by other processes, such as laminating and coating.

FIG. 9 shows the film formed as an IC wafer separator 20. The separator 20 is the film 29 cut into a circular shape. The separator 20 has a diameter that is slightly larger than the diameter of the particular integrated circuit wafers. Each wafer 19 has a circuit side and an opposite or grind side. As shown in FIG. 2, separators 20 are placed between the wafers 19. The insulating layer 53 is located in contact with the circuit side of the wafer (see FIG. 13). The dissipative layer 51 is located in contact with the grind (or other) side of the next adjacent wafer. Thus, the insulating layer 53 is interposed between the sensitive circuits and the dissipative layer 51. A stack of wafers 19 and separators 20 is formed and placed into the container 11. The wafers 19 contact only the separators 20 and not other wafers.

As discussed previously, the film 29 is also used to make the top and bottom cushions 21, 23.

Figure 11:
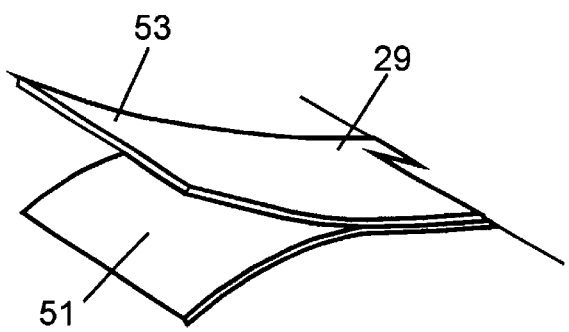
FIG. 11 is an isometric view of the film, shown with the layers partially separated for illustrative purposes, wherein the film is not embossed.
Figure 12:
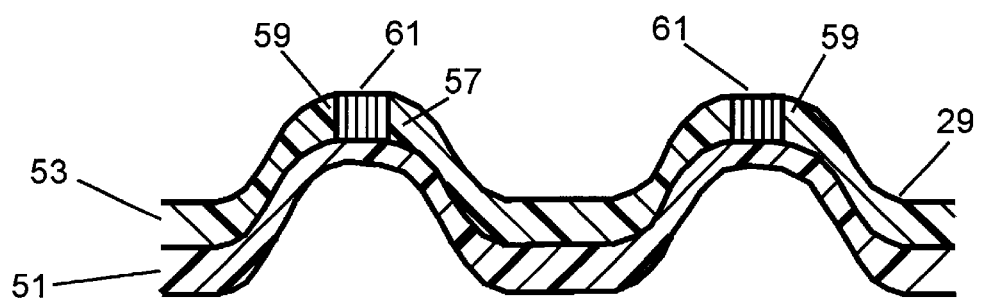
FIG. 12 shows a detailed cross-sectional view of the film of FIG. 10.
Figure 13:
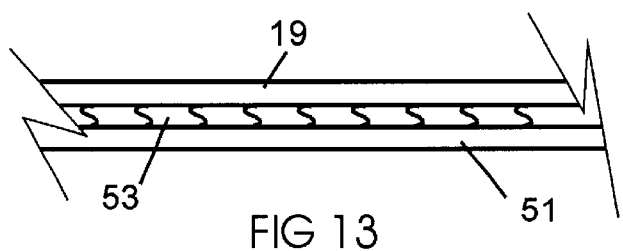
FIG. 13 shows a detailed cross-sectional view of the film of FIG. 11.

The film 29 can be embossed 57 as shown in FIGS. 9 and 10. The embossing is done from the dissipative layer 51 to the insulating layer 53 as shown in FIG. 12. The embossing minimizes two separators 20 from sticking to each other. This makes their use much easier, especially in clean room conditions under which IC wafers are handled. The film 29 need not be embossed, as shown in FIGS. 11 and 13.

With the film 29 of the present invention, static-sensitive articles, such as integrated circuits (either in wafers or individually), are protected from static discharge. The dissipative layer 51 is made dissipative by the presence of carbon in the polymer. The dissipative layer presents a high resistance path to ground. Any static charge that accumulates on an adjacent article dissipates into the dissipative layer. Because the resistance of the dissipative layer is between $1 \times 10^4$ to $1 \times 10^{11}$ ohms, the charge dissipates in a controlled manner so as not to damage the article.

The insulating layer 53 protects the article from the carbon. If the article was in direct contact with the dissipative layer, then carbon particles can be sloughed off and remain in contact with the articles. Having such dissipative particles in contact with sensitive articles, such as integrated circuits, is an undesirable contamination. The insulating layer prevents this sloughing of carbon (or other dissipative) particles onto the wafer.

Yet, the insulating layer is configured so as to allow static discharges to pass therethrough. Thus, the insulating layer does not interfere with the electrostatic discharge capabilities of the dissipative layer. The insulating layer, which is a polymer, has myriad microscopic channels therethrough, which channels can serve as paths for static discharges. Polymers typically have some porosity which is a function of the type of polymer, the thickness of the polymer and the particular material which is able to penetrate the polymer. An example of such porosity can be measured as the moisture vapor transmission rate (MVTR). Molecules of water vapor can penetrate some polymer layers. The penetration is possible because the polymer layer has a myriad of microscopic paths for the vapor molecules to follow through the layer.

The present invention utilizes the fact that a thin film of polymer has such microscopic paths therethrough. It is believed that these paths are used to conduct static charges through the insulating layer to the dissipative layer. Thus, the film 11 is thin enough to conduct charges, yet thick enough to provide mechanical protection to the article as well as to the dissipative layer. In a sense, this is the opposite of a layer of electrical insulation around a length of wire. Although, the wire insulation provides mechanical protection for the wire, it also electrically insulates the wire from stray charges or grounding.

If the film is embossed, then the peaks 59 caused by the embossments are likely to be in contact with the wafer. Consequently, the dissipative paths 61 (shown for illustrative purposes) are likely to be at the peaks, as shown in FIG. 12. FIG. 12 shows a cross-section taken from multi-layer film that is constructed of two layers where the first layer is dissipative and the second layer is insulating. The two layers are co-extruded together and the combination is embossed. Electrical dissipative paths through the insulating layer are created at the peaks of the embossment.

Figure 14:
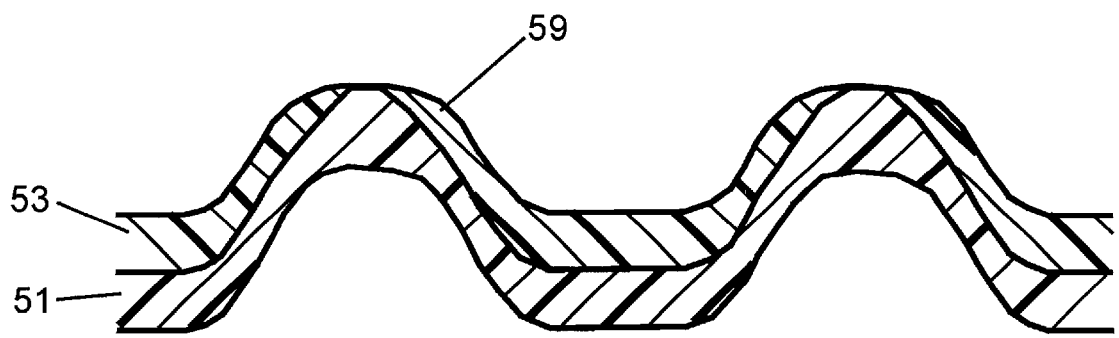
FIG. 14 shows a detailed cross-sectional view of the film, in accordance with another embodiment, showing penetration of the insulating layer by the embossing.

The microscopic paths that are normally present in the insulating layer can be enlarged upon if desired. For example, in some situations, the insulating layer may have to be thicker in order to provide more mechanical protection. Dissipative paths can be made by creating holes in the insulating layers. FIGS. 14–18 illustrate several methods of making these holes. FIG. 14 shows the multi-layer film with the embossment in which the dissipative paths, at the peaks, are created by a physical penetration of the dissipative layer through the insulating layer. The embossing causes openings in the insulating layer. Typically these openings are at the embossment peaks.

Figure 15:
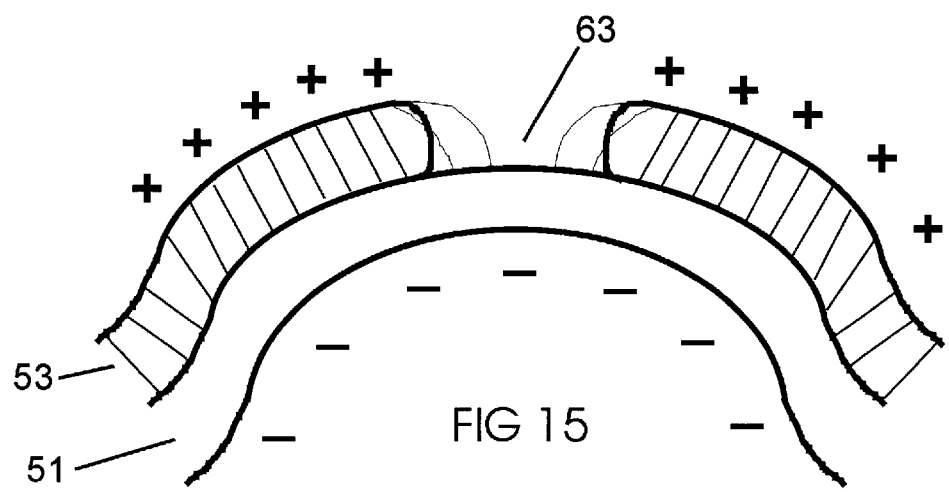
FIG. 15 is a detailed cross-sectional view of the peak of an embossment of a FIG. 14.

FIG. 15 shows one peak of the multi-layer film with a puncture or perforation at the peak providing a dissipative path. Conduction of free charges occurs when the electric field between the surface charges and the dissipative layer is sufficiently strong to ionize the air in the puncture opening 63.

Figure 16:
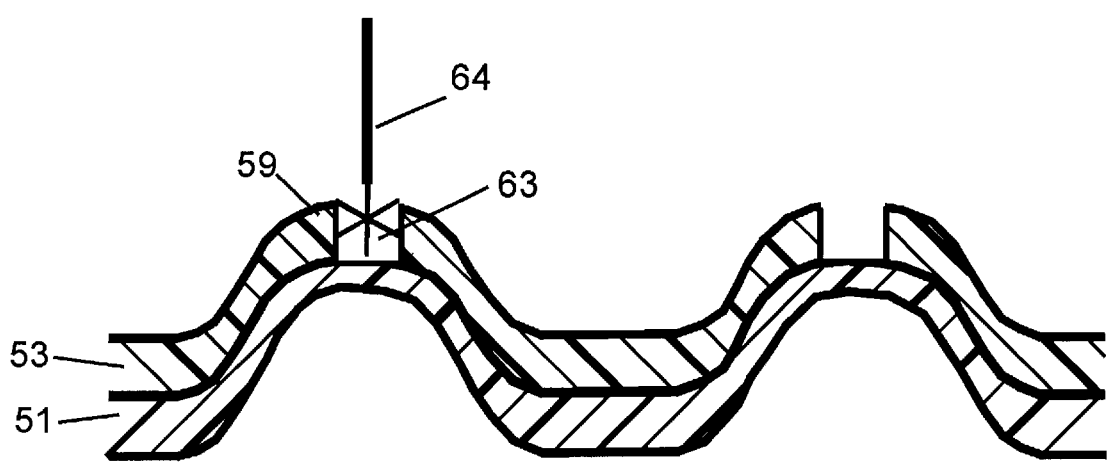
FIG. 16 is a detailed cross-sectional view of the film, illustrating another method of making holes at the peaks of the embossments.

FIG. 16 shows the multi-layer film where the insulating layer has holes 63 to the dissipative layer, which holes are created by a scanning laser beams 64.

Figure 17:
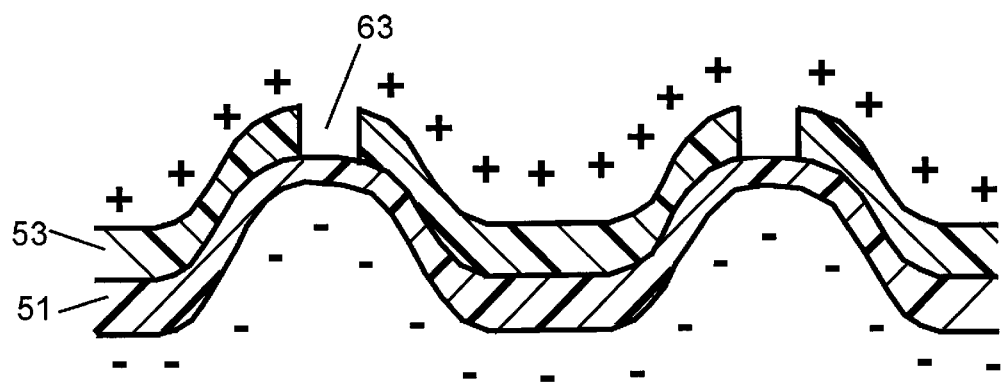
FIG. 17 is a detailed cross-sectional view of the film, illustrating still another method of forming holes at the peaks of the embossments.

FIG. 17 shows creation of punctures 63 at the embossment peaks by means of electrical break down of the insulating layer due to the electric field stress of an accumulated surface charge. The charge can be induced during manufacture. Puncture can also occur due to charge accumulated during use of the film.

Figure 18:
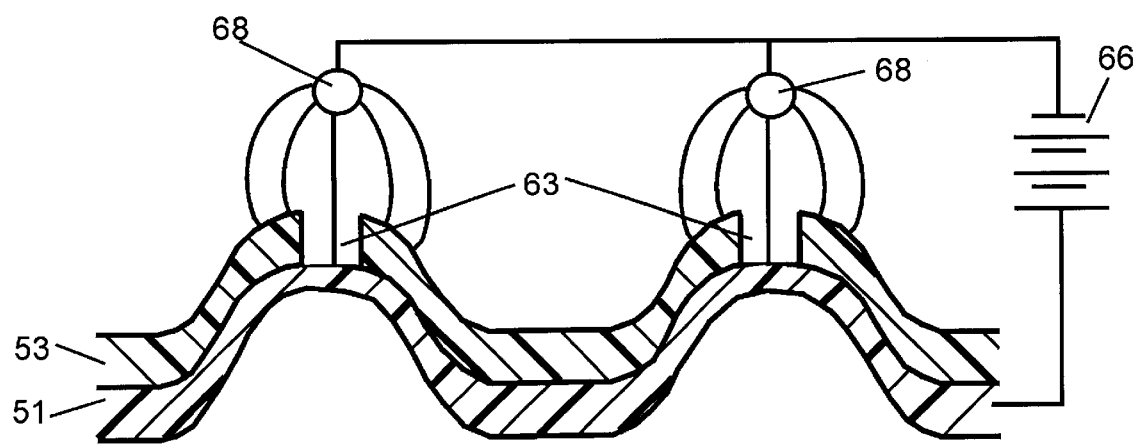
FIG. 18 is a detailed cross-sectional view of the film, illustrating still another method of forming holes at the peaks of the embossments.

In FIG. 18, punctures 63 occur due to the electric field induced by a nonionizing high voltage electrode. A high voltage source 66 is connected between the electrodes 68 and the dissipative layer 51. Field stress enhancement of the embossment will cause puncture at the peaks or surface of minimum radius.

The multi-layer film 29 provides for conduction of a surface charge through at least one insulating film layer to at least one dissipative film layer. The dissipative layer of film is typically a matrix of carbon that provides some conductivity. The insulating film layer prevents sloughing of carbon particles from the dissipative layer. Conductivity from the outer surface of the insulating layer is desirable where there is a need for protection against electrostatic discharge.

The multi-layer film can be converted to such things as a bag for storing and shipping sensitive articles and/or separators. A sensitive article includes IC wafers, disk drives, electronics, semiconductors, etc. For example, the use of this multi-layer film could be as: (1) a bag that holds a sensitive article that requires electrostatic protection without the transfer of carbon particles to the article or (2) a separator placed next to the electrical side of an IC wafer that separates said wafer from a second wafer or a multiple of wafers packaged within a shipping container. When the film is used for wafer separation, the purpose is to: (1) prevent transfer or "sloughing" of carbon particles from the dissipative layer onto bond pad surface areas of IC wafers, (2) maintain an ion contaminant free surface that would otherwise cause corrosive damage to said bond pads and (3) to provide surface resistance that remains within desired dissipative range of $1 \times 10^4$ to $1 \times 10^{11}$ ohms that otherwise could cause catastrophic damage to electrical function of wafers.

Figure 19:
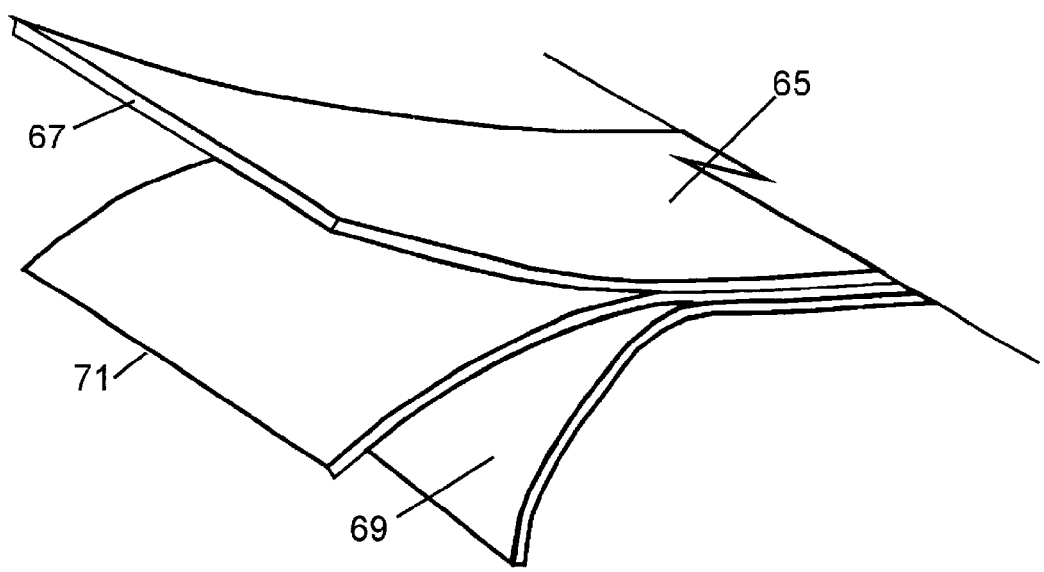
FIG. 19 is an isometric view of the film, in accordance with another embodiment, with the layers partially separated for illustrative purposes.
Figure 20:
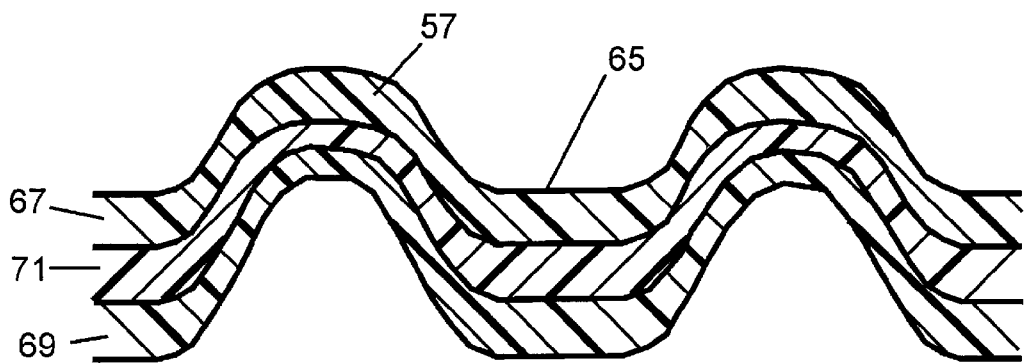
FIG. 20 is a detailed cross-sectional view of the film of FIG. 19.

FIG. 19 shows an elevational view of a co-extruded multiple layer film 65 material having three layers and FIG. 20 shows a cross-section taken from FIG. 19 that is constructed from three layers where the first layer 67 and third layer 69 is insulating. The inner layer 71 is conductive having a surface resistivity of $10^4$ ohms or less. The film 65 is useful for producing or lining enclosures such as flexible bags to shield sensitive articles stored therein from damage caused by electromagnetic interference (EMI) and radio frequency interference (RFI) frequencies. When the conductive layer has a quantity of carbon therein to lower its surface resistivity to such levels, the polymer is unable to mechanically fix all of the carbon. As a result, carbon powder may be generated. By sealing the conductive layer between two insulating layers, the carbon is retained inside of the film and will not contaminate the contents of the enclosure.

Figure 21:
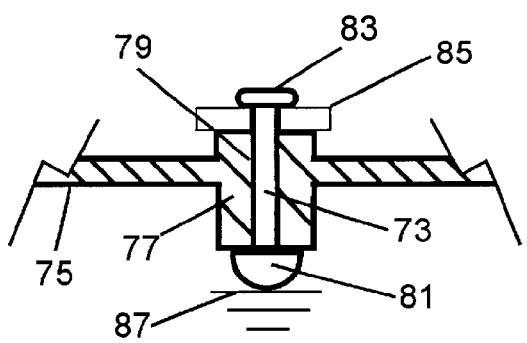
FIG. 21 is a detailed cross-sectional view of a grounding stud.

Referring to FIG. 21, the container is provided with a grounding stud 73. The stud 73 provides a conductive path for electrical charges that occur inside of the container to exit the container harmlessly. The bottom wall 75 of the container bottom 15 has a reinforced portion 77. A bore 79 extends through the bottom wall at the reinforced portion 77. A conductive stud 73 extends through the bore 79. The stud can be made of brass or some other metal. On the outside of the container bottom 15, the stud has a head 81. Likewise, on the inside of the container bottom 15, the stud has a head, such as in the form of a brad 83. A washer 85 can be located between the brad 83 and the reinforced portion 77.

When the container is assembled as shown in FIG. 3, the brad 83 is in contact with the dissipative film of the bottom cushion. The head 81 is preferably in contact with a ground 87. For example, the container 11 can be placed on a grounded metal surface. The head extends sufficiently far from the bottom wall so as to contact the grounding surface.

If a charge should occur on a wafer 19, then that charge can find its way to ground 87 in a controlled manner without damaging the sensitive electronics in the wafer. The separators 20, the wafers 19 themselves, the film 29 around the top and bottom cushions 21, 23 and the grounding stud 73 provide a path to ground.

The foregoing disclosure and the showings made in the drawings are merely illustrative of the principles of this invention and are not to be interpreted in a limiting sense.

What is claimed is:

1. A system for protecting integrated circuit wafers during storage and shipment, comprising:
   a) a container having an interior space for receiving the wafers;
   b) first and second cushions positioned inside of the interior space so as to receive the wafers therebetween;
   c) each of the first and second cushions having a compressible and resilient foam, with the foam being enclosed within a membrane, the membrane having one or more openings so as to allow gas to pass therethrough;
   d) the membrane of each of the first and second cushions comprises a film for protecting the wafers from electrostatic discharge, the film comprising a first layer made of a polymer with dissipative material therein and a second layer coupled to the first layer, the second layer made of a polymer without the dissipative material.

2. The system of claim 1 wherein the wafers are in a stack configuration, with each of the wafers in the stack being separated from adjacent wafers by a separator, each of the separators comprising:
   a) a first layer made of a polymer with dissipative material therein;
   b) a second layer coupled to the first layer, the second layer made of a polymer without the dissipative material.

3. The system of claim 1 wherein the wafers are in a stack configuration, with each of the wafers in the stack being separated from adjacent wafers by a separator, each of the separators comprising a first film, the membrane of each of the first and second cushions comprises a second film for protecting the wafers from electrostatic discharge, the first and second films comprising:
   a) a first layer made of a polymer with dissipative material therein;
   b) a second layer coupled to the first layer, the second layer made of a polymer without the dissipative material.

4. The system of claim 3 further comprising a grounding conductor in contact with a portion of the second film and extending to an exterior of the container.

5. The system of claim 1 further comprising side cushions located around a periphery of the wafers, the side cushions comprising resilient projections extending from a base piece.

6. The system of claim 5 wherein the first and second cushions each comprise flanges, the side cushions being interposed between the flanges.

7. The system of claim 1 wherein each of the first and second cushions comprises a first membrane piece and a second membrane piece, the first and second membrane pieces each having edges and being coupled together along the edges so as to form an enclosure that receives the foam.

8. A system for providing protection from electrostatic discharge, comprising:
   a) a wafer comprising an integrated circuit, the wafer having a circuit side;
   b) a film having a dissipative layer and an insulating layer, the film being in contact with the circuit side of the wafer such that the insulating layer is interposed between the dissipative layer and the wafer;
   c) a container having an interior, the wafer and the film being located in the container interior, the container having a conductive path from the container interior to an exterior of the container.

9. The system of claim 8 wherein the dissipative layer of the film has a surface resistance of between $1 \times 10^4 – 1 \times 10^{11}$ ohms.

10. A method for protecting an integrated circuit wafer from electrostatic discharge, the wafer having a circuit side, comprising the steps of:
    a) providing a film having a dissipative layer and a insulating layer;
    b) locating the film in contact with the circuit side of the wafer such that the insulating layer is interposed between the dissipative layer and the wafer;
    c) positioning the wafer and the film inside of a container;
    d) passing a static charge from the wafer to the dissipative layer through the insulating layer and out of the container to an exterior of the container.

11. A system for protecting integrated circuit wafers during storage and shipment, comprising:
    a) a container having an interior an interior space for receiving the wafers;
    b) first and second cushions positioned inside of the interior space so as to receive the wafers therebetween;
    c) each of the first and second cushions comprising compressible and resilient foam;
    d) the first and second cushions comprising a dissipative path for electrical charges;
    e) a grounding conductor in contact with a portion of the dissipative path of at least one of the first and cushions and extending to an exterior of the container, the first and second cushions and extending to an exterior of the container.

12. The system of claim 11 wherein the dissipative path comprises a film around the foam of the respective first and second cushions.

* * * * *